United States Patent [19]
De

[11] Patent Number: 6,166,584
[45] Date of Patent: *Dec. 26, 2000

[54] FORWARD BIASED MOS CIRCUITS

[75] Inventor: Vivek K. De, Hillsboro, Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/880,047

[22] Filed: Jun. 20, 1997

[51] Int. Cl.$^7$ ...................................................... H03K 3/01
[52] U.S. Cl. ............................................. 327/534; 327/537
[58] Field of Search .................................... 327/530, 534, 327/535–537, 538, 540–546, 404, 427, 434, 436

[56] References Cited

U.S. PATENT DOCUMENTS

| | | | |
|---|---|---|---|
| 4,565,960 | 1/1986 | Takata et al. | 323/317 |
| 5,422,591 | 6/1995 | Rastegar et al. | 327/409 |
| 5,461,338 | 10/1995 | Hirayama et al. | 327/538 |
| 5,489,870 | 2/1996 | Arakawa | 327/536 |
| 5,557,231 | 9/1996 | Yamaguchi et al. | 327/534 |
| 5,559,368 | 9/1996 | Hu et al. | 257/369 |
| 5,689,144 | 11/1997 | Williams | 327/534 |
| 5,689,209 | 11/1997 | Williams et al. | 327/425 |
| 5,703,522 | 12/1997 | Arimoto et al. | 327/534 |
| 5,880,620 | 3/1999 | Gitlin et al. | 327/534 |
| 5,909,140 | 6/1999 | Choi | 327/534 |
| 6,046,627 | 4/2000 | Itoh et al. | 327/546 |

OTHER PUBLICATIONS

Assaderaghi, F., et al, "A Dynamic Threshold Voltage MOSFET (DTMOS) for Ultra–Low Voltage Operation", IEEE IEDM 94 Tech. Dig., pp. 809–812, 1994.

S. Thompson et al., "Dual Threshold Voltages and Substrate Bias: Keys to High Performance, Low Power, 0.1 $\mu$m Logic Designs," 1997 Symposium on VLSI Technology Digest of Technical Papers, pp. 69–70.

T. Kuroda et al., "A 0.9–V, 150–MHz, 10–mW, 4mm$^2$, 2–D Discrete Cosine Transform Core Processor with Variable Threshold–Voltage (VT) Scheme," IEEE Journal of Solid–State Circuits, vol. 31, No. 11, Nov. 1996, pp. 1770–1779.

M. Aoki et al., "0.1 $\mu$m CMOS Devices Using Low–Impurity–Channel Transistors (LICT)," 1990 IEDM Tech. Digest, pp. 939–941.

D. Antoniadis, "Physics and Technology of Ultra Short Channel MOSFET Devices," 1991 IEDM Technical Digest, pp. 21–24.

M. Rodder et al., "A Sub–0.18$\mu$m Gate Length CMOS Technology for High Performance (1.5V) and Low Power (1.0V)," 1996 IEDM Tech. Digest, pp. 563–566.

C. Wann et al., "A Comparative Study of Advanced MOSFET Concepts," IEEE Transactions on Electron Devices, vol. 43, No. 10, Oct. 1996, pp. 1742–1753.

(List continued on next page.)

*Primary Examiner*—My-Trang Nu Ton
*Attorney, Agent, or Firm*—Alan K. Aldous

[57] ABSTRACT

The present invention includes a semiconductor circuit including one or more transistors each having a body and one or more a variable voltage source to selectively provide a forward bias to the bodies at certain times and to provide a non-forward bias to the body at other times. The semiconductor circuit includes voltage control circuitry to control whether the variable voltage source provides the forward bias or the non-forward bias. In some embodiments of the invention, the voltage control circuit controls the variable voltage source such that the forward bias is provided during an active mode of the transistors and the non-forward bias is provided during a standby mode of the transistors. In some embodiments of the invention, the voltage control circuitry derives a priori knowledge of the mode of the transistor.

9 Claims, 5 Drawing Sheets

OTHER PUBLICATIONS

S. Mutoh et al., "1–V Power Supply High–Speed Digital Circuit Technology with Multithreshold–Voltage CMOS," IEEE J. of Solid–State Circuits, vol. 30, No. 8, Aug. 1995, pp. 847–853.

B. Streetman, Solid State Electronic Devices, pp. 317–319 (Prentice–Hall, Inc., 2nd Ed. 1980).

H. Kotaki et al., "Novel Bulk Dynamic Threshold Voltage MOSFET (B–DTMOS) with Advanced Isolation (SITOS) and Gate to Shallow–Well Contact (SSS–C) Processes for Ultra Low Power Dual Gate CMOS," IEDM 96 (Dec. 1996), pp. 459–462.

S. Mutoh et al., "1–V Power Supply High–Speed Digital Circuit Technology with Multithreshold–Voltage CMOS," IEEE Journal of Solid–State Circuits, vol. 30, No. 8, Aug. 1995, pp. 847–854.

C. Splain et al., "Ultra Low Voltage Complementary Metal Oxide Semiconductor (ULV–CMOS) Circuits: Bulk CMOS Operation Below Threshold (VTO)," IEEE Southeastcon '96, Apr. 1996, pp. 670–673.

F. Assaderaghi et al., "High–Performance Sub–Quarter–Micron PMOSFET's in SOI," IEEE Electron Device Letters, vol. 14, No. 6, Jun. 1993, pp. 298–300.

L. De Chiaro et al., "Improvements in Electrostatic Discharge Performance in InGaAsP Semiconductor Lasers by Facet Passivation," IEEE Transactions on Electron Devices, vol. 39, No. 3, Mar. 1992, pp. 561–565.

W. Walker et al., "Design and Analysis of a CMOS SOS/SOI Receiver for a Radiation Hard Computer," 1989 IEEE SOS/SOI Technology Conference, Oct. 3–5, 1989, pp. 167–168.

S. Krishnan et al., "BiMOS Modeling for Reliable SOI Circuit Design," 1996 IEEE International SOI Conference Proceedings, Sep. 30, 1996, pp. 140–141.

H. Clement–Wann et al., "Channel Doping Engineering of MOSFET with Adaptable Threshold Voltage Using Body Effect for Low Voltage and Low Power Applications," 1995 International Symposium on VLSI Technology Systems and Applications, Proceedings of Technical Papers, May 31, 1995, pp. 159–163.

R. Williams, "MOSFET Flyback–Diode Conduction and dV/dt Effects in Power Ics in Low–Voltage Motor Control Applications," Proceedings of the 3rd International Symposium on Power Semiconductor Devices and ICs, Apr. 1991, pp. 254–57.

T. Kuroda et al., "Substrate Noise Influence on Circuit Performance in Variable Threshold Voltage Scheme," 1996 International Symposium on Low Power Electronics and Design, Digest, Aug. 12–14, 1996, pp. 309–312.

T. Kuroda et al., "Threshold–Voltage Control Schemes through Substrate–Bias for Low–Power High–Speed CMOS LSI Design," J. of VLSI Signal Processing Systems 13 (1996), pp. 191–201.

T. Kuroda et al., "A 0.9V 150MHz 10mW 4mm2 2–D Discrete Cosine Transform Core Processor with Variable Threshold–Voltage Scheme," 1996, IEEE International Solid–State Circuits Conference (ISSCC96), Feb. 1996, pp. 166–167.

Kobayashi, T., et al., "Self–Adjusting Threshold–Voltage Scheme (SATS) for Low–Voltage High–Speed Operation", Proceedings of the IEEE 1994 Custom Integrated Circuits Conference, San Diego, CA, May 1–4, 1994, pp. 271–274.

Kuroda, T. et al., "High–speed low–power 0.3um CMOS gate array with variable threshold voltage (VT) scheme", IEEE 1996 Custom Integrated Circuits Conference, May 5–8, 1996, pp. 53–56.

Mizuno, H. et al., "A Lean–Power Gigascale LSI using Hierarchical VBB Routing Scheme with Frequency Adaptive VT CMOS", Symposium on VLSI Circuits Digest of Technical Papers, Jun. 1997, pp. 95–96.

Mizuno, M. et al., SA 18.2: Elastic–Vt CMOS Circuits for Multiple On–Chip Power Control, 1996 IEEE International Solid–State Circuits Conference, Feb. 8–10, 1996, pp. 300–301.

Mutoh, S. et al., "1V High–Speed Digital Circuit Technology With 0.5um Multi–Threshold CMOS", Proceedings 1993 IEEE ASIC Conference, pp. 186–189.

Seta, K. et al., "FP 19.4: 50% Active–Power Saving Without Speed Degradation Using Standby Power Reduction (SPR) Circuit", 1995 IEEE International Solid–State Circuits Conference Digest of Technical Papers, Feb. 1995, pp. 318–319.

James Kao, "Soias for Temperature and Process Control," Massachusetts Institute of technology, 6.374 Project, December 1996.

FORWARD BIASED MOS CIRCUITS

BACKGROUND OF THE INVENTION

1. Technical Field of the Invention

The present invention relates to semiconductor circuits and, more particularly, to semiconductors circuits in which a semiconductor body is forward biased during an active mode, but not during a standby mode.

2. Description of Prior Art

In conventional static, dynamic, and differential complementary metal oxide semiconductor (CMOS) logic and memory circuits, an n-Channel metal oxide semiconductor field effect transistor (MOSFET) (nMOS transistor) or a p-Channel MOSFET (pMOS transistor) is used with its body terminal connected to the ground or supply node, respectively. Other static circuit schemes have been proposed where a reverse bias is applied statically or dynamically to the body node of a MOSFET to reduce subthreshold leakage current when the MOSFET is not switching. In these schemes, the body of the pMOS transistor is connected to a voltage source larger than the supply voltage, and the body of the AMOS transistor is connected to a voltage source smaller (more negative) than the ground potential.

The maximum achievable performance and the minimum supply voltage allowed at a desired performance level in microprocessor and communication chips which use the above-recited schemes are limited by 1) the intrinsic transistor drive current and 2) the controllability of device parameters offered by the process technology. The predominant source of device parameter fluctuations across a die is a variation of critical dimension (CD). In order that the MOSFET characteristics do not vary by unacceptably large amounts in response to CD-variations, the device should be carefully engineered to have sufficiently large short-channel-effect (SCE), drain-induced-barrier-lowering (DIBL), and punch-through (PT) immunity. As the minimum feature size scales beyond, for example, 0.18 micrometers, the available design space for construction of a MOSFET which provides sufficient drive current at low supply voltages while maintaining adequate SCE, DIBL, and PT immunity becomes severely restricted. These design challenges for ultra-small bulk MOSFETs can pose a major barrier to achieving the performance and power goals in future generations of microprocessor, communication, and memory chips. In addition, these design difficulties can cause the development cost of future process technologies to escalate by large amounts.

Accordingly, there is a need for transistors that supply a relatively large amount of drive current with relatively small supply and gate voltages.

SUMMARY OF THE INVENTION

The present invention includes a semiconductor circuit including a transistor having a body and a variable voltage source to selectively provide a forward bias to the body at certain times and to provide a non-forward bias to the body at other times. The semiconductor circuit includes voltage control circuitry to control whether the variable voltage source provides the forward bias or the non-forward bias.

In some embodiments of the invention, the voltage control circuit controls the variable voltage source such that the forward bias is provided during an active mode of the transistor and the non-forward bias is provided during a standby mode of the transistor.

In some embodiments of the invention, the voltage control circuitry derives a priori knowledge of the mode of the transistor.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION OF THE PREFERRED EMBODIMENTS

Figure 1:
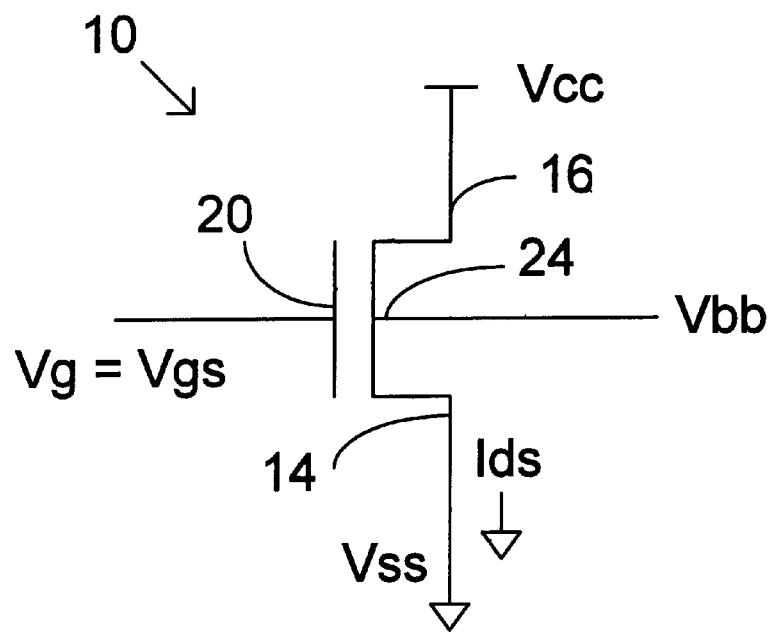
FIG. 1 is a schematic representation of a transistor according one embodiment of the present invention.
Figure 2:
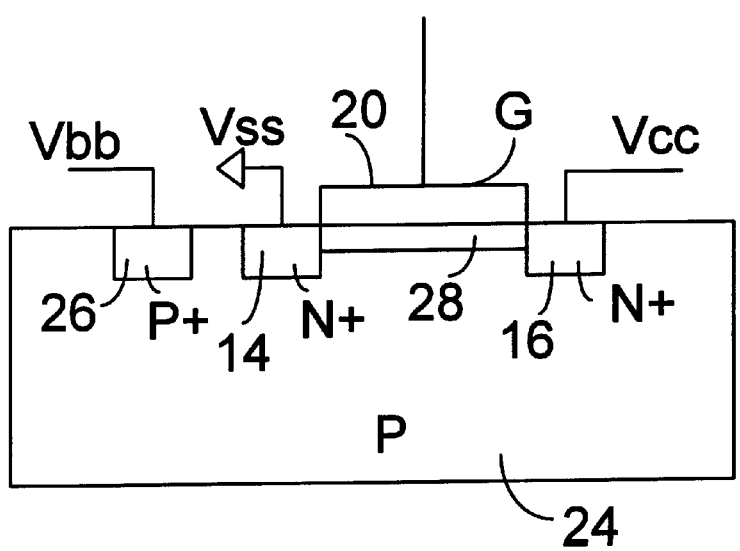
FIG. 2 is a cross-sectional view of the transistor of FIG. 1.

Referring to FIGS. 1 and 2, a MOSFET transistor 10 includes a source 14 at a reference voltage Vss (which may be earth ground), a drain 16 receiving a source voltage Vcc, a channel 28, and a gate 20 receiving a gate voltage Vg. (In practice, there may be resistors or other elements between Vcc, Vss, Vg, and drain 14, source 16, and gate 20, respectively.) Gate 20 is an example of a control voltage port. If source 14 is at the reference voltage, the gate-to-source voltage Vgs equals the gate voltage Vg.

Transistor 10 is an nMOS or n-Channel transistor in which a body or substrate 24 is of a doped P type material, and source 14 and drain 16 are each of N+ type material. A P+ type tap 26 provides a path to body 24. Transistor 10 has a threshold voltage Vt that may be defined as the voltage applied between the gate and the source below which the drain-to-source current Ids drops to very close to zero. Transistors that are used in connection with the present invention are not limited to the particular details of transistor 10, which are provided only by way of example.

A body bias voltage Vbb is applied to body 24 through tap 26. When transistor 10 is active (i.e., frequently receiving and acting on input signals), the voltage Vbb is such that a forward bias is applied to body 24 with Vbb being higher than Vss. The threshold voltage without a forward body bias is Vt(NFB). The threshold voltage with a forward bias is Vt(FB). In practice, Vt(FB) is lower than Vt(NFB). With a lower threshold voltage, transistor 10 can provide a greater drive current for a given Vgs. (The drive current is the maximum drain-to-source current Ids for a given maximum Vgs.) For example, transistor 10 in a forward bias condition can provide the same drive current with a lower Vgs as compared to transistor 10 not in a forward bias condition. Likewise, transistor 10 in a forward bias condition can provide a greater drive current with the same Vgs and Vcc as compared to transistor 10 not in a forward bias condition. A forward bias leads to a lower threshold voltage Vt, an increase in drive current, and faster switching for a given Vgs, Vcc, and Vds.

Preferably, the amount of the forward bias is less than or equal to the built-in potential Vpn of the pn junction between body 24 and source 14. The built-in potential Vpn for silicon MOS transistors is about 0.7 volts. Vbb may be on the verge of full forward biasing but not be actually to full forward biasing. Merely as an example, and not a limitation, the forward bias could be about 500 millivolts for some embodiments of the invention.

In spite of its advantages, a forward bias also has the tendency to increase leakage current of transistor 10, which is undesirable. During active mode, the leakage may be tolerated because of the circuit speed benefits. However, during standby mode of the transistor, when input signals are not being received and increased performance is not important, to avoid leakage, Vbb may be changed from a forward bias to a zero bias, a substantially zero bias, or a reverse bias. A "substantially zero bias" includes a range from a very small forward bias to a very small reverse bias, and significant leakage may occur during substantially zero bias. Leakage is much smaller or non-existent with a reverse bias condition.

Figure 3:
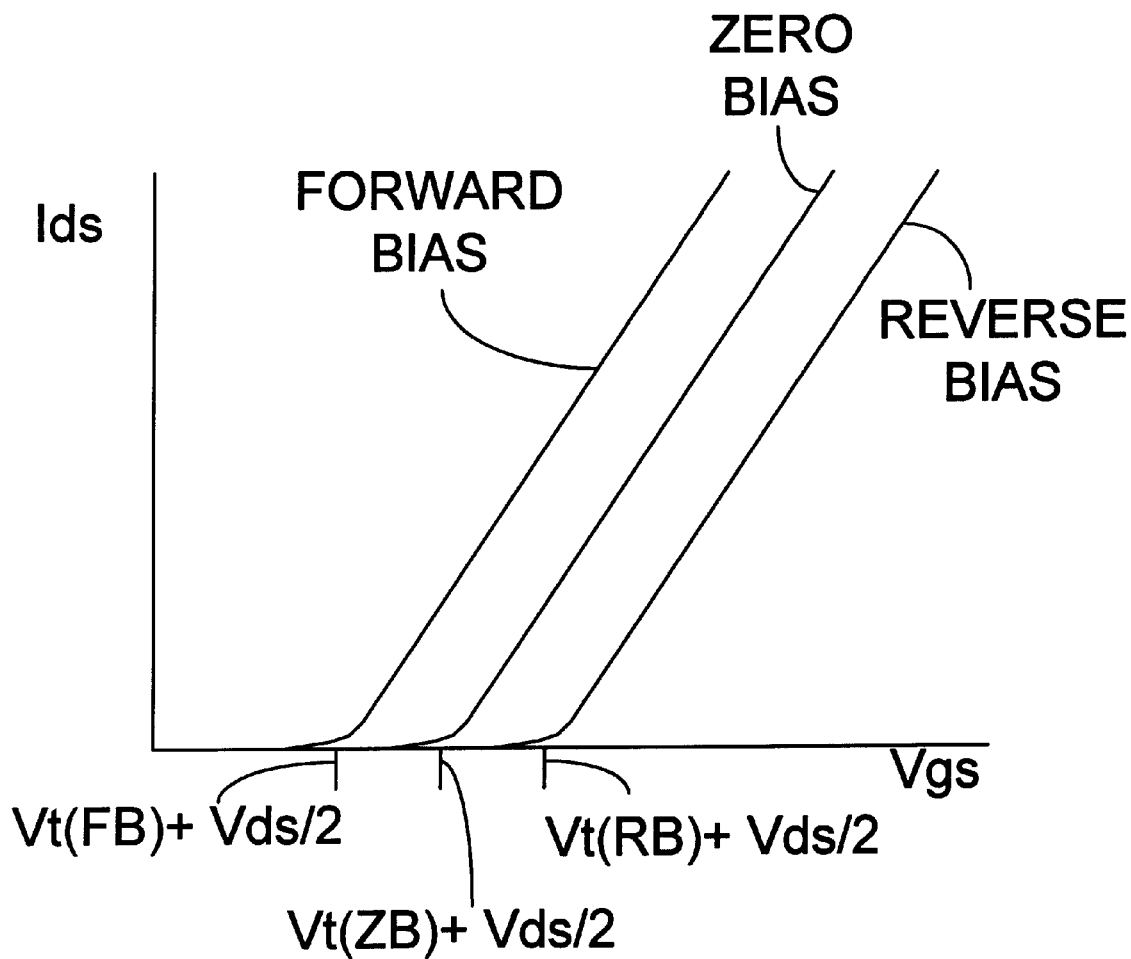
FIG. 3 is a graphical representation of drive current Ids vs. gate-to-source voltage Vgs for a forward bias, zero bias, and a reverse bias in the transistor of FIG. 1.

FIG. 3 is a graph including three curves for drain-to-source current Ids as a function of gate-to-source voltage Vgs for a given drain-to-source voltage Vds. FIG. 3 includes Ids vs. Vgs curves for three different body bias conditions: a forward bias, zero bias, and a reverse bias. The threshold voltage Vt for a MOS transistor is the voltage applied between gate and source below which the drain-to-source current Ids is very close to zero. The threshold voltage Vt(FB) is the threshold voltage associated with the forward bias curve. The threshold voltage Vt(ZB) is the threshold voltage associated with the zero bias curve. The threshold voltage Vt(RB) is the threshold voltage associated with the reverse bias curve. The curves include a generally linear region and a non-linear region that approaches zero. There are three vertical lines that touch the Vgs axis. If the three linear regions continued so as to intersect the Vgs axis, the points of intersection would be at the points where the three vertical lines touch the Vgs axis. Theoretically, the linear portion of the forward bias curve would intersect at VT(FB)+Vds/2. Theoretically, the linear portion of the zero bias curve would intersect at Vt(ZB)+Vds/2. Theoretically, the linear portion of the reverse bias curve would intersect at Vt(RB)+Vds/2. As can be seen, the threshold voltage is smaller with a forward bias than with a zero bias or a reverse bias. Merely as an example, and not a limitation, Vds could be 50–100 mv for some embodiments of the invention. The graph of FIG. 3 is provided to illustrate the general effect of body biasing on threshold voltage and is not intended to be precisely accurate. Not every transistor according to the present invention is required to have curves that have the appearance of those of FIG. 3.

Figure 4:
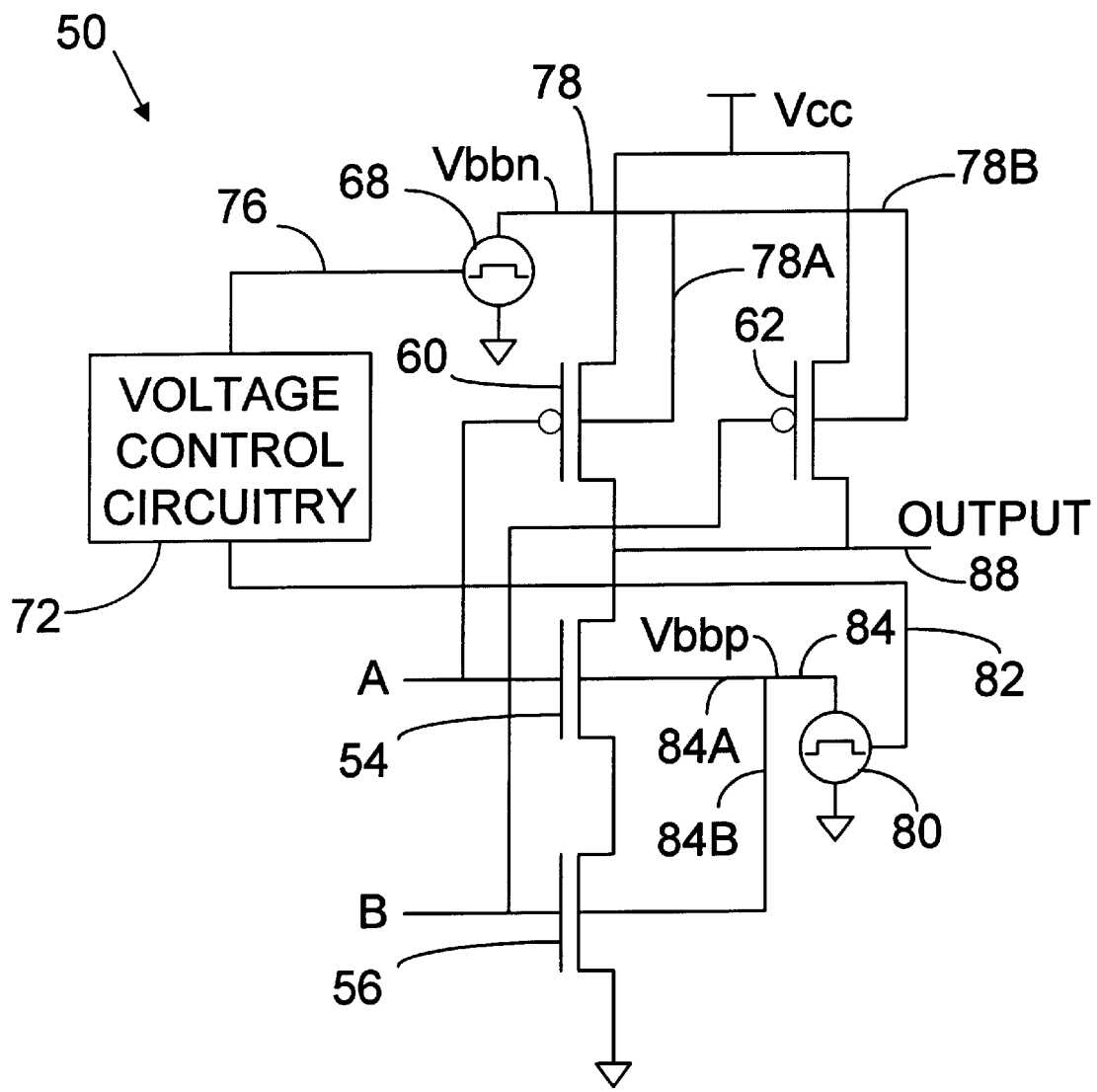
FIG. 4 is a schematic representation of a two-input NAND gate according to one embodiment of the invention.

Referring to FIG. 4, an example of present invention is illustrated in connection with a two-input NAND gate circuit 50 having inputs A and B at the gates of nMOS transistors 54 and 56 and at the gates of pMOS transistors 60 and 62. The sources of transistors 60 and 62 are connected in parallel to the output of circuit 50 on conductor 88. As is well known, the voltage at conductor 88 is determined according to the logic of a NAND gate depending on the inputs A and B.

A voltage Vbbn is supplied to the bodies of transistors 60 and 62 on conductors 78 (including conductors 78A and 78B) from a variable voltage source 68. The voltage level of voltage Vbbn is controlled by voltage control circuitry 72, which controls variable voltage source 68 through conductor 76. A voltage Vbbp is supplied to the bodies of transistors 54 and 56 on conductors 84 (including conductors 84A and 84B) from a variable voltage source 80. The voltage level of voltage Vbbp is controlled by voltage control circuitry 72, which controls variable voltage source 80 through conductor 82. When circuitry 50 is in the active mode, Vbbn and Vbbp are in the forward bias condition and transistors 54, 56, 60, and 62 are forward biased. When circuitry 50 is in the standby mode, Vbbn and Vbbp are in the zero, substantially zero, or reverse bias conditions. Zero, substantially zero, and reverse bias conditions are each examples of non-forward bias conditions during which transistors 54, 56, 60 and 62 are not forward biased. Circuitry 50 may include resistors or other components not illustrated in FIG. 4.

For nMOS transistors, when forward bias is desired, the body bias voltage Vbbp applied on conductors 84 from variable voltage source 80 is Vss+X1. When non-forward bias is desired, Vbbp is Vss−X2. For pMOS transistors, when forward bias is desired, the body bias voltage Vbbn applied on conductor 78 from variable voltage source 68 is Vcc−X3. When non-forward bias is desired, Vbbn is Vcc+X4. The following chart summarizes the body bias voltages for certain embodiments of the invention for various cases:

| Transistor | Bias | Voltage Bias Voltage | Mode |
|---|---|---|---|
| nMOS | Forward | Vbbp = Vss + X1 | typically active |
| nMOS | Non-forward | Vbbp = Vss − X2 | typically standby |
| pMOS | Forward | Vbbn = Vcc − X3 | typically active |
| pMOS | Non-forward | Vbbn = Vcc + X4 | typically standby |

In preferred embodiments, 0<X5<Vpn; 0<X3<Vpn; 0<X2; and 0<X4. Values X1, X2, X3, and X4 may each equal each other. Alternatively, some of values X1, X2, X3, and X4 ma) equal each other, while others of values X1, X2, X3, and X4 do not. For example, values X1 and X3 may equal each other, but be different than values X2 and X4. Values X2 and X4 may equal each other, but be different than values X1 and Xp3. If X1 and X3 are greater than Vpn, there could be a significant amount of conduction between the source/drain to body junctions, which is undesirable.

Figure 5:
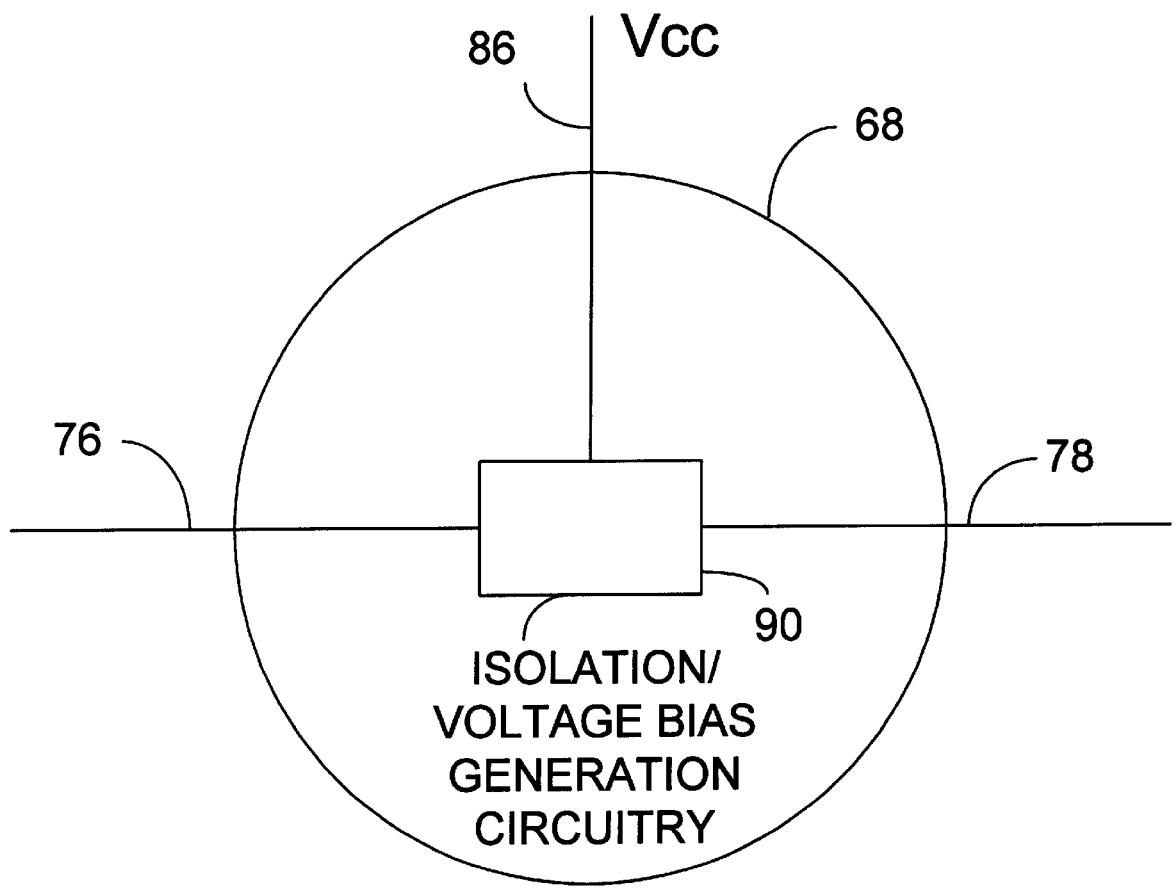
FIG. 5 is an example of a voltage source used in FIG. 4.

FIG. 5 illustrates details of one embodiment of variable voltage source 68, which is representative of variable voltage source 80. Variable voltage source 80 is analogous to variable voltage source 68. Isolation/voltage bias generation circuitry 90 receives a voltage control signal on conductor 76 from voltage control circuitry 72 and receives Vcc through conduct 86. Isolation/voltage bias generation circuitry 90 supplies Vbbn to transistors 60 and 62 through conductors 78, 78A, and 78B. Any of various well known circuits could be used to implement isolation/voltage bias generation circuitry 90.

In some embodiments of the invention, voltages Vbbp and Vbbn may be in a forward biased condition even when transistors 54, 56, 60, and 62 are temporarily in the standby mode (i.e., when there are no A and B inputs to act on). Further, voltages Vbbp and Vbbn may be in a non-forward biased condition when transistors 54, 56, 60, and 62 are temporarily in the active mode (i.e., when there are A and B inputs to act on). One reason for doing so is that it may be desirable to not rapidly change the body bias voltage and to just keep a forward bias condition if the transistors will rapidly change between active and standby modes. Another reason for doing so it that transistors 54, 56, 60, and 62 may be part of larger circuitry arid voltage control circuitry 72 may provide body bias control to all the circuits. Accordingly, some of the transistors could be in a different mode from transistors 54, 56, 60, and 62. This is discussed in greater detail with respect to FIG. 6 as follows.

Figure 6:
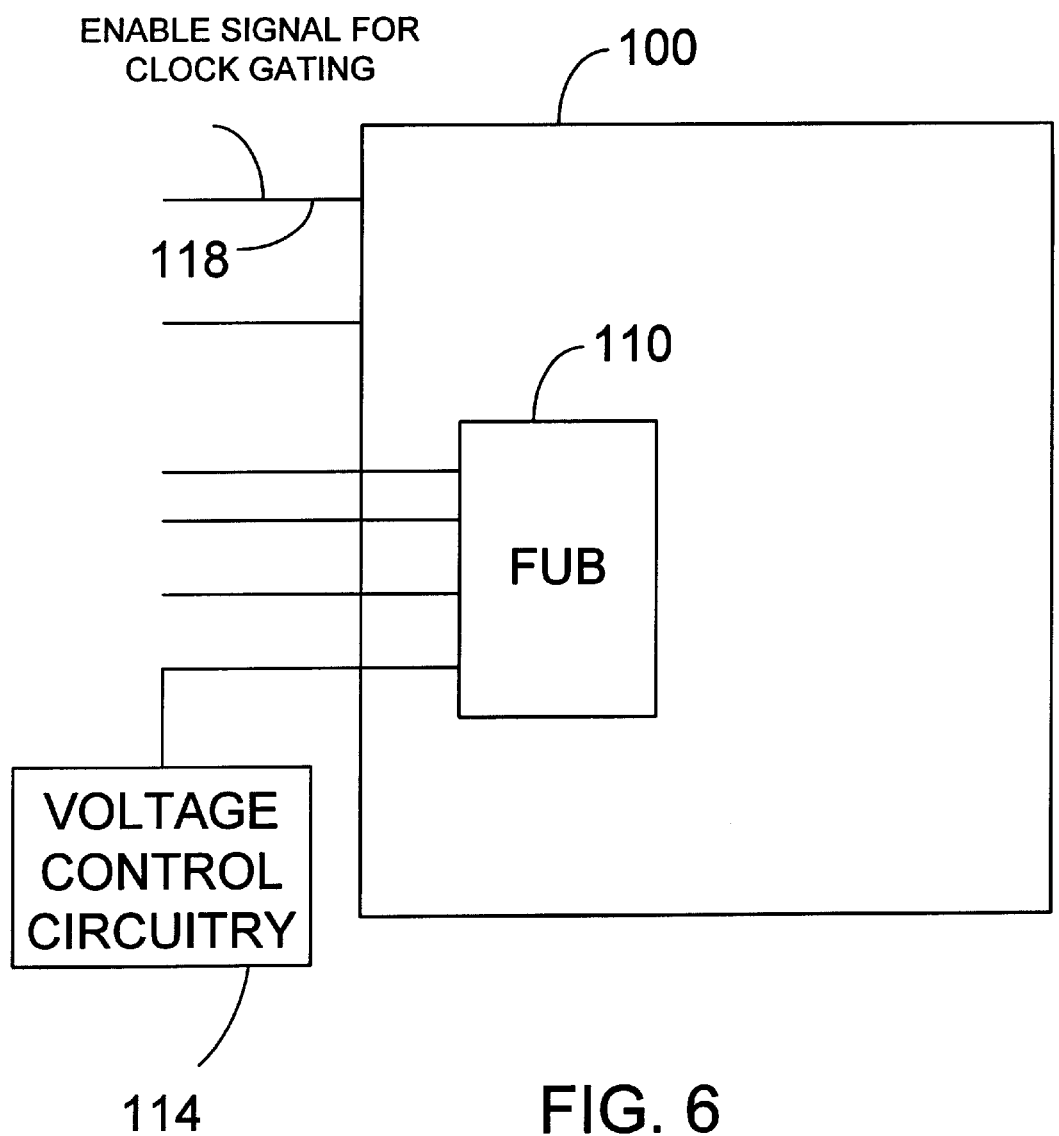
FIG. 6 is a block diagram representation of circuitry including a functional unit block (FUB) that selectively receives forward biasing according to one embodiment of the present invention.

FIG. 6 illustrates exemplary circuitry 100 that includes a functional unit block (FUB) 100 that receives voltage control signals from voltage control circuitry 114 for numerous nMOS and pMOS circuits in FUB 110. Voltage control circuitry 114 determines a priori or simultaneously when FUB 110 will be in active mode and when it will be in standby mode. Voltage control circuitry 114 can make the a priori or simultaneous determination through various means. For example, the same circuitry that controls the applications of input s to FUB 110 can also supply that information to voltage control circuitry 114 with advance or concurrent notice. It is possible that some transistors within FUB 110 will be in active mode, at the same time other transistors within FUB 110 will be in standby mode. Voltage control circuitry 114 may follow certain rules in determining whether FUB 110 as a whole is in active or standby mode. For example, a rule could be that if 50% of the transistors to be are to be in the active mode, the entire FUB 110 is in active mode. Other rules could be used with different percentages. Also, voltage control circuitry 114 could ignore temporary conditions in which a large percentage of transistors are to be in standby mode. Rather than be concerned with the percentage of transistors, the rule could be to put voltages Vbbp and Vbbn in the forward bias condition if any of the transistors in a group are to be in the active mode. Voltages Vbbp and Vbbn could remain in the forward condition for at least a certain number of clock cycles. The rules could be flexible to balance speed and leakage. The enable signal for clock gating on conductor 118 could be supplied in connection with voltage control circuitry 114 or independently of voltage control circuitry 114.

It is not required that each transistor be in the forward or non-forward bias conditions at the same time. That is, some transistors may be forward biased while other transistors are non-forward biased.

Various embodiments of the present invention include static or quasi-static, limited and controlled forward biasing of the body node of any/all pMOS or nMOS or both in any static/dynamic/differential MOS logic and memory circuitry implemented in bulk silicon. The term "static forward bias" means that the bias is constantly forward, regardless of whether the circuits are in active or standby modes. The term "quasi-static" means a forward bias is applied during only a portion of the time, while a zero bias, substantially zero bias or reverse bias is applied during some other times. The bias voltage can be generated and distributed from a voltage source either on-chip or off-chip. Forward-biasing of different n-wells and p-wells by different amounts can be used to generate an assortment of n- and p-MOSFETs with varying degrees of leakage and drive currents on the same die.

The present invention allows low-cost, high-performance, and low-power microprocessor and communication chips in, for example, sub-0.18 micrometer technology generations. The invention provides a means of providing leakier, higher-performance MOSFETs on the same die that contains low-leakage, lower performance transistors through affordable process technology. This helps with the noise-immunity requirements of dynamic CMOS logic and memory circuits. Accordingly, the invention can potentially eliminate additional masking steps and process complexities inevitable in a multiple-threshold-voltage process, and thus provide a low-cost alternative to design and manufacture of future high-performance/low-power microprocessors and communication chips.

As examples, the present invention may be applied to all or selected nMOS/pMOS devices in (1) conventional static CMOS logic and memory circuits, (2) all varieties of dynamic or differential CMOS logic circuits (e.g. Domino, D1/D2 Domino, self-resetting (SR)-Domino, Zipper, Dual-Rail Domino, cascode voltage switch logic (CVSL), cascode differential nMOS logic (CDNL), etc.) and (3) pass transistors, resident in clock drivers/receivers, latches/flip-flops, control logic datapath logic, I/O drivers/receivers etc., each of which may be used inside or in connection with a microprocessor. The present invention provides significant speed improvements compared to present technology. In particular, the following nMOS/pMOS devices may benefit from the invention: (1) transistors in static CMOS gates resident in critical paths, (2) clocked transistors in gated or untagged clock drivers, (3) clocked transistors in domino logic, and (4) transistors in a static receiver logic stage at the output of a domino gate.

In preferred embodiments of the invention applied to all or selected nMOS/pMOS devices in the aforementioned circuits, the invention enables ultra-aggressive scaling of supply voltage in selected portions of all parts of a chip without incurring any speed penalty, thus providing significant reductions in active power consumption at a desired performance level set by the process technology.

Preferred embodiments of the invention alleviates the signal swing degradation across non-complementary pass transistors. Preferred embodiments of the invention significantly improves the device parameters control on a die (by improving the SCE/DIBL/PT characteristics of MOSFETs) which is a key limiter to both performance enhancement and supply voltage scaling for lower power.

Preferred embodiments of the invention can eliminate additional masking steps and process complexities inevitable in a multiple-threshold-voltage process, and yield an assortment of n- and p-MOSFETs with varying degrees of leakage and drive currents on the same die at low cost.

The various structures of the present invention may be implemented according to any of various materials and methods known to those skilled in the art. There may be intermediate structure (such as a buffer or resistor) or signals that are between two illustrated structures. Some conductors may not be continuous as illustrated, but rather be broken up by intermediate structure. The borders of the boxes in the figures are for illustrative purposes. An actual device would not have to include such defined boundaries. The relative size of the illustrated components is not to suggest actual relative sizes.

In the specification and drawings, reference or illustration of a "conductor" could include a single conductor or parallel conductors carrying signals.

The term "connected" and related terms are used in an operational sense and are not necessarily limited to a direct connection. If the specification states a component "may", "can", "could", or is "preferred" to be included or have a characteristic, that particular component is not required to be included or have the characteristic.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A semiconductor circuit, comprising:
   a functional unit block including transistors having a body and a gate; and
   voltage control circuitry to control through the bodies of the transistors whether the transistors are in an active mode in which all the transistors in the functional block unit are forward biased or in a standby mode in which all the transistors in the functional block unit are non-forward biased, the voltage control circuitry using at least one rule to determine whether to place the transistors in the active or the standby mode, wherein the at least one rule includes placing all the transistors of the function unit block in the active mode if any one of the transistors in the function unit block is to be in the active mode.

2. The circuit of claim 1, wherein the voltage control circuitry has the transistors remain in the active made by ignoring temporary conditions in which a large percentage of the transistors are to be in the standby mode.

3. The circuit of claim 1, wherein the functional unit block includes variable voltage sources to generate signals Vbbn and Vbbp, and wherein the transistors are in the active mode when the signals Vbbn and Vbbp are within first and second ranges, respectively, and the transistors are in the standby mode if the signals Vbbn and Vbbp are out of the first and second ranges, and wherein the signals Vbbn and Vbbp remain in the first and second ranges for least a certain number of clock cycles.

4. The circuit of claim 1, further comprising first and second variable voltage sources to generate signals Vbbn and Vbbp, wherein the transistors are in the active mode when the signals Vbbn and Vbbp are within first and second ranges, respectively, and the transistors are in the standby mode if the signals Vbbn and Vbbp are out of the first and second ranges, the first and second variable voltage sources being positioned between the voltage control circuitry and the transistors, and wherein the transistors include pMOS transistors having bodies receiving the Vbbn signal and nMOS transistors receiving the Vbbp signal, wherein the Vbbn and Vbbp signals remain in the first and second ranges for at least a certain number of clock cycles.

5. The circuit of claim 1, wherein the circuit includes additional transistors that are not in the functional unit block and that are not forward body biased.

6. A semiconductor circuit, comprising:

a functional unit block including nMOS transistors and pMOS transistors;

a first variable voltage source to provide a signal Vbbp to the nMOS transistors and wherein if the Vbbp signal is in a first range, the nMOS transistors arc forward biased and in an active mode and otherwise the nMOS transistors are non-forward biased and in a standby mode, and a second variable voltage source to provide a signal Vbbn to the pMOS transistors and wherein if the Vbbn signal is in a second range, the pMOS transistors are forward biased and in the active mode and otherwise the pMOS transistors are non-forward biased and in the standby mode; and voltage control circuitry to control whether the first and second variable transistors provide the signal Vbbp in the first range and the signal Vbbn in the second range, the voltage control circuitry using at least one rule to determine whether the signal Vbbp is in the first range and the signal Vbbn is in the second range, wherein the at least one rule includes placing all the transistors of the function unit block in the active mode if any one of the transistors in the function unit block is to be in the active mode.

7. The circuit of claim 6, wherein the voltage control circuitry has the transistors remain in the active mode by ignoring temporary conditions in which a large percentage of the transistors are to be in the standby mode.

8. The circuit of claim 6, wherein the signals Vbbn and Vbbp remain in the first and second ranges for least a certain number of clock cycles.

9. The circuit of claim 6, wherein the circuit includes additional transistors that are not in the function unit block and that are not forward body biased.

\* \* \* \* \*

UNITED STATES PATENT AND TRADEMARK OFFICE
CERTIFICATE OF CORRECTION

PATENT NO. : 6,166,584
DATED : December 26, 2000
INVENTOR(S) : De

It is certified that error appears in the above-identified patent and that said Letters Patent is hereby corrected as shown below:

Column 1,
Line 22, delete "AMOS", insert -- nMOS --.

Column 4,
Lines 28 and 29, delete "$0 < X5 < Vpn; 0 < X3 < Vpn; 0 < X2;$ and $0 < X4$", insert -- $0 \leq X1 \leq Vpn; 0 < X3 \leq Vpn; 0 \leq X2;$ and $0 \leq X4$ --.
Line 31, delete "ma)", insert -- may --.
Line 61, delete "arid", insert -- and --.

Signed and Sealed this

Twenty-ninth Day of June, 2004

JON W. DUDAS
*Acting Director of the United States Patent and Trademark Office*